(12) United States Patent
Gotoh et al.

(10) Patent No.: US 7,543,375 B2
(45) Date of Patent: Jun. 9, 2009

(54) PROCESS FOR FILLING VIA HOLE IN A SUBSTRATE

(75) Inventors: Masashi Gotoh, Tokyo (JP); Kaoru Kawasaki, Tokyo (JP); Hiroshi Yamamoto, Tokyo (JP); Mutsuko Nakano, Tokyo (JP)

(73) Assignee: TDK Corporation, Tokyo (JP)

( * ) Notice: Subject to any disclaimer, the term of this patent is extended or adjusted under 35 U.S.C. 154(b) by 71 days.

(21) Appl. No.: 10/549,571

(22) PCT Filed: Mar. 18, 2004

(86) PCT No.: PCT/JP2004/003681

§ 371 (c)(1),
(2), (4) Date: May 26, 2006

(87) PCT Pub. No.: WO2004/084594

PCT Pub. Date: Sep. 30, 2004

(65) Prior Publication Data

US 2006/0223307 A1    Oct. 5, 2006

(30) Foreign Application Priority Data

Mar. 20, 2003    (JP) .............................. 2003-077581

(51) Int. Cl.
*H01K 3/10* (2006.01)
(52) U.S. Cl. ........................... 29/852; 29/846; 174/262; 205/170; 205/191; 216/18; 216/65; 427/97.9
(58) Field of Classification Search .................. 29/825, 29/846, 852, 853, 874; 174/262, 266; 216/17, 216/18, 65, 94; 205/105, 118, 123–125, 205/170, 173, 183, 187, 191, 202; 427/97.7, 427/97.9, 98.2
See application file for complete search history.

(56) References Cited

U.S. PATENT DOCUMENTS

| | | | | |
|---|---|---|---|---|
| 4,804,615 | A * | 2/1989 | Larson et al. | 205/126 |
| 6,380,065 | B1 * | 4/2002 | Komai et al. | 438/639 |
| 6,590,165 | B1 * | 7/2003 | Takada et al. | 174/266 |
| 6,698,093 | B2 * | 3/2004 | Nishii | 29/852 |

FOREIGN PATENT DOCUMENTS

| | | |
|---|---|---|
| JP | 2001-144444 | 5/2001 |
| JP | 2002-9434 | 1/2002 |

(Continued)

*Primary Examiner*—Donghai D. Nguyen
(74) *Attorney, Agent, or Firm*—Oblon, Spivak, McClelland, Maier & Neustadt, P.C.

(57) ABSTRACT

A process for producing an electronic component The electronic component includes a base material equipped with a core material and having a conductor layer on at least one surface thereof; a via hole formed through laser irradiation from the other surface side of the base material; a first plating layer formed by using the conductor layer as an electrode so as to cover the core material, which is exposed on an inner wall surface of the via hole; an electroless plating layer which is formed on the upper side of the first plating layer and which is in close contact with the inner wall surface of the via hole; and a second plating layer formed by using the conductor layer as an electrode so as to cover the electroless plating layer. A conductor part is formed in the via hole.

3 Claims, 5 Drawing Sheets

FOREIGN PATENT DOCUMENTS

| | | |
|---|---|---|
| JP | 2002-76617 | 3/2002 |
| JP | 2002-151623 | 5/2002 |
| JP | 2002-161391 | 6/2002 |
| JP | 2002-164663 | 6/2002 |
| JP | 2002-190672 | 7/2002 |
| JP | 2002-208763 | 7/2002 |
| JP | 2002-252466 | 9/2002 |
| JP | 2002-261440 | 9/2002 |
| JP | 2002-314254 | 10/2002 |
| WO | 02/062116 | 8/2002 |

* cited by examiner

RELATED ART FIG. 6A
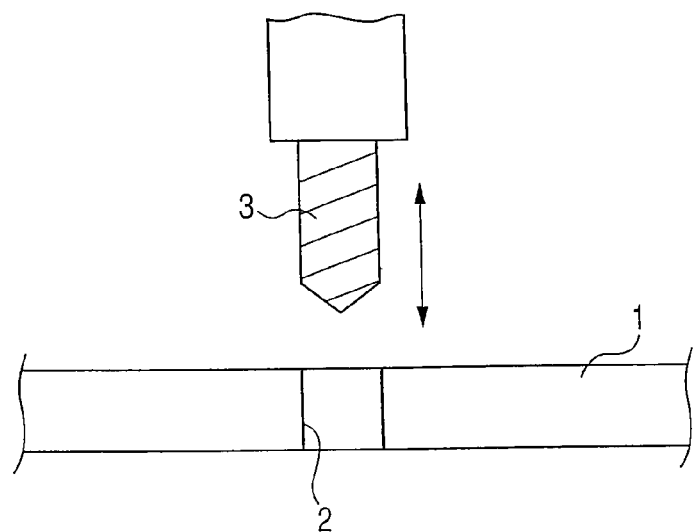
RELATED ART FIG. 6B
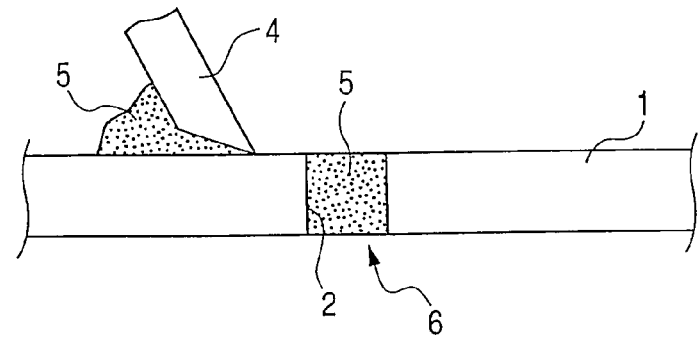
RELATED ART FIG. 6C
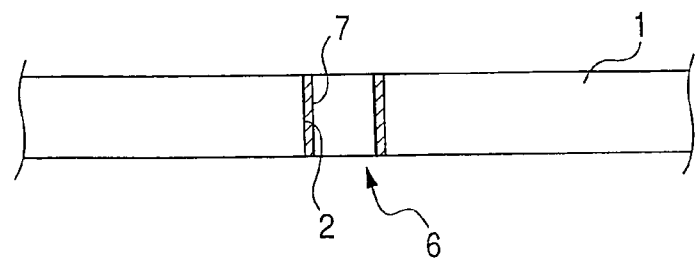

PROCESS FOR FILLING VIA HOLE IN A SUBSTRATE

TECHNICAL FIELD

The present invention relates to a process for producing an electronic component and an electronic component, and in particular, a process for producing an electronic component in which conduction processing is effected between the upper surface and lower surface of a base material and such an electronic component.

BACKGROUND ART

Conventionally, there have been known an electronic component and a printed circuit board in which wiring patterns are formed on the upper and lower surfaces of a base material and in which these wiring patterns are connected through the base material.

And, to form such a structure, there have been proposed and disclosed various producing methods of forming a via hole in a base material, and then forming a conductor part in the via hole. FIGS. 6A, 6B, and 6C are explanatory sectional views illustrating a conventional method of forming a via hole and a conductor part.

As shown in FIG. 6A, conventionally, to form a via hole 2 in a base material 1, the base material 1 in which the via hole 2 is to be formed is set first on a stage (not shown). From above the base material 1 set on the stage, a drill 3 with an outer diameter corresponding to the hole diameter of the via hole 2 is lowered to perform drilling, thereby forming the via hole 2. When forming a plurality of via holes 2 in the base material 1, the stage or the drill 3 is translated along the surface of the base material, and drilling is repeated.

After the via hole 3 has been thus formed in the base material 1, a conductor part is formed in the via hole 3. FIG. 6B shows a first method of forming the conductor part; according to FIG. 6B, after the via hole 2 has been formed in the base material 1, the via hole 2 is filled with a conductive paste 5 containing a powdered low resistance metal, such as gold, silver, copper, or aluminum by using a squeegee 4 to thereby form a conductor part 6.

FIG. 6C shows a second method of forming a conductor part; according to FIG. 6C, after the via hole 2 has been formed in the base material 1, a metal layer 7 is formed on the inner wall surface of the via hole 2 by electroless plating, and this metal layer is used as the conductor part 6.

However, due to the reduction in via hole diameter as a result of a demand for a reduction in the size of electronic components, the method of forming a via hole and the method of forming a conductor part in a via hole, described above, involve the following problems.

The method of forming a via hole has a problem in that when the drill diameter is reduced as a result of a reduction in the via hole diameter, the machining with the drill becomes rather difficult, and the service life (work life) of the drill is shortened.

The method of forming a conductor part by filling a via hole with a conductive paste has a problem in that when the via hole is reduced in diameter, it becomes rather difficult to fill the via hole with the conductive paste by using a squeegee. Further, the conductive paste contains resin in addition to the metal powder, so that the resistance value of the conductor part increases, with the result that the heat dissipation property deteriorates, and a reduction in resistance cannot be achieved. The smaller the inner diameter of the via hole, the more serious these problem become.

Further, also in the method in which a conductor part is formed by electroless plating, the via hole is not filled with metal but involves generation of voids, so that, as in the method using a conductive paste, the resistance value of the conductor part increases, with the result that the heat dissipation property deteriorates, and a reduction in resistance cannot be achieved.

To solve the above-mentioned problems, a method is known in which a via hole is formed by laser irradiation and in which metal is deposited in the via hole by electroplating to form a conductor part (metal conductor) (see, for example, Patent Document 1).

<Patent Document 1>
Japanese Patent Application Laid-Open No. 2001-144444 A (Claim 3, FIG. 1)

However, in the method in which a via hole mentioned above is formed by laser irradiation, and a metal conductor is then formed, there occurs the following problem.

That is, in the method in which a conductor part is formed in a via hole by electroplating, the deposition rate is higher than that in the case of electroless plating, and while it is possible to form a conductor part in the via hole in a short time, the conductor part formed by deposition by the electroplating has a problem in that the bonding strength at the via hole interface, that is, between itself and the base material end surface. Thus, when an external force is applied to the base material, or when the base material repeatedly undergoes dimensional fluctuation due to changes in temperature and humidity, separation occurs at the interface due to the stress caused by the dimensional fluctuation of the base material, so that there is a fear of the conductor part being detached from the via hole.

In the case of the processing by laser irradiation, the hole has a trapezoidal sectional configuration, and a tapered portion is formed, so that not only a force in the shearing direction but also a force in the separating direction is applied to the interface, thereby making the separation more conspicuous.

DISCLOSURE OF THE INVENTION

In view of the above-mentioned problems in the prior art, it is an object of the present invention to provide a process for producing an electronic component which is superior in heat dissipation property, helps to achieve low resistivity, and makes it possible to prevent detachment of the conductor part from the base material, and an electronic component produced by such a process.

The present invention has been made in view of the fact that the conductor part can be brought into firm and close contact with the base material by additionally performing, during electroplating, electroless plating, which has high affinity with respect to the base material surface, or by forming a protrusion exerting an anchoring action on the via hole end surface.

That is, a process for producing an electronic component according to the present invention includes: forming a via hole in a base material having a conductor layer on at least one surface thereof by performing laser irradiation from the other surface side of the base material; forming a conductor part in the via hole through deposition of plating in the via hole using the conductor layer as an electrode; and causing an electroless plating to be deposited in the via hole such that an electroless plating layer in close contact with an inner wall surface of the via hole extends in the thickness direction of the conductor part.

More specifically, a process for producing an electronic component, which effects conduction processing between front and back surfaces of a base material equipped with a core material and having a conductor layer formed on one surface thereof, includes: forming a via hole in the base material having the conductor layer by performing laser irradiation at least from the other surface side of the base material; forming an electroless plating layer in close contact with an inner wall surface of the via hole after deposition of a plating until the core material exposed on the inner wall surface of the via hole is covered by using the conductor layer as an electrode; and depositing a plating again by using the conductor layer as an electrode so as to cover the electroless plating layer to thereby form a conductor part in the via hole.

It is desirable that the core material be caused to protrude from the inner wall surface of the via hole through laser irradiation to thereby form an anchor structure with respect to the conductor part.

A process for producing an electronic component according to another aspect of the present invention, which effects conduction processing between front and back surfaces of a base material equipped with a core material and having a conductor layer formed on one surface of the basic material, includes: forming a via hole in the base material having the conductor layer by performing laser irradiation at least from the other surface side of the base material; causing the core material to protrude from an inner wall surface of the via hole; and depositing a plating by using the conductor layer as an electrode so as to form an anchor structure together with the core material protruding from the inner wall surface of the via hole to form a conductor part in the via hole.

It is desirable that the core material be formed of glass cloth.

Further, an electronic component according to the present invention includes: a base material having on at least one surface thereof a conductor layer; a via hole formed through laser irradiation from the other surface side of the base material; an electroless plating layer which is in close contact with an inner wall surface of the via hole; and a conductor part which covers the electroless plating layer and which is formed in the via hole.

More specifically, an electronic component includes: a base material equipped with a core material and having a conductor layer on at least one surface thereof; a via hole formed through laser irradiation from the other surface side of the base material; a first plating layer formed by using the conductor layer as an electrode so as to cover the core material, which is exposed on an inner wall surface of the via hole; an electroless plating layer which is formed on the upper side of the first plating layer and which is in close contact with the inner wall surface of the via hole; and a second plating layer formed by using the conductor layer as an electrode so as to cover the electroless plating layer. A conductor part is formed in the via hole by the first plating layer, the electroless plating layer, and the second plating layer.

Further, it is desirable that a protrusion be formed on the inner wall surface of the via hole, the protrusion and the conductor part forming an anchor structure.

Further, it is preferable that the protrusion be formed by the core material protruding from the inner wall surface of the via hole, and that the core material be formed of glass cloth.

An electronic component according to another aspect of the present invention includes: a base material having a conductor layer on at least one surface thereof; a via hole formed through laser irradiation from the other surface side of the base material; a protrusion protruding from an inner wall surface of the via hole; and a conductor part which forms an anchor structure together with the protrusion formed in the via hole to be thereby prevented from being detached from the protrusion.

Further, it is desirable that the protrusion be formed by the core material, which is included in the basic material, protruding from the inner wall surface of the via hole. Further, the core material is preferably formed of glass cloth.

In the above-described construction, the electroplating process for forming the conductor part is divided into at least two steps, and electroless plating is conducted in between the steps, so that an electroless plating layer is formed on the inner wall surface of the via hole. Thus, the electroless plating layer is firmly held in close contact with the via hole inner wall surface side and with the electroplating side, with the result that, even if a stress is applied to the base material, no separation occurs between the conductor part and the via hole end surface, thereby preventing detachment of the conductor part.

Incidentally, the construction of the present invention, in which the core material is caused to protrude from the inner wall surface of the via hole and in which the first plating layer and the anchor structure are formed so that the core material may not come into contact with the electroless plating layer, is adopted for the following reason.

That is, when electroplating is conducted using the conductor layer as an electrode, plating grows from the conductor layer side; when an electroless plating layer has been formed previously on the inner wall surface of the via hole, electricity also flows through this electroless plating layer, and there is a fear of an increase in plating thickness in an edge portion where electric field concentration is likely to occur, that is, in the opening edge portion of the via hole and the core material portion protruding from the inner wall surface of the via hole. When, as a result of this increase in plating thickness, the opening of the via hole is blocked, and voids are generated in the conductor part, the resistance value of the conductor part increases or the heat dissipation property deteriorates. As described above, in order to prevent such problems, the present invention adopts a construction in which the electroless plating layer does not come into contact with the core material. In the step of applying an electroless plating solution, a liquid inflicting damage to the core material is used for a long period of time, so that the resin, in particular, the core material suffers damage, and residue of the solution is likely to remain. When the core material thus suffers damage, and there remains solution residue, there is a fear of a deterioration in humidity resistance in the product. In the present invention, it is also possible to avoid such problems, thus contributing to an improvement in reliability in the product.

Apart from the above construction, by causing the core material to protrude from the end surface of the via hole, and by forming an anchor structure by the core material thus protruding from the end surface and the conductor part, it is possible, as in the above-described construction, to prevent detachment of the conductor part even if a stress is applied to the base material.

These two constructions, described above, are not independent of each other; it goes without saying that it is possible to achieve a further improvement in reliability through a combination of these two constructions.

BRIEF DESCRIPTION OF THE DRAWINGS

FIGS. 6A, 6B, and 6C are explanatory sectional views illustrating a conventional process for forming a via hole and a conductor part.

BEST MODE FOR CARRYING OUT THE INVENTION

In the following, a preferred specific embodiment of an electronic component producing method and an electronic component according to the present invention will be described in detail with reference to the drawings.

Figure 1:
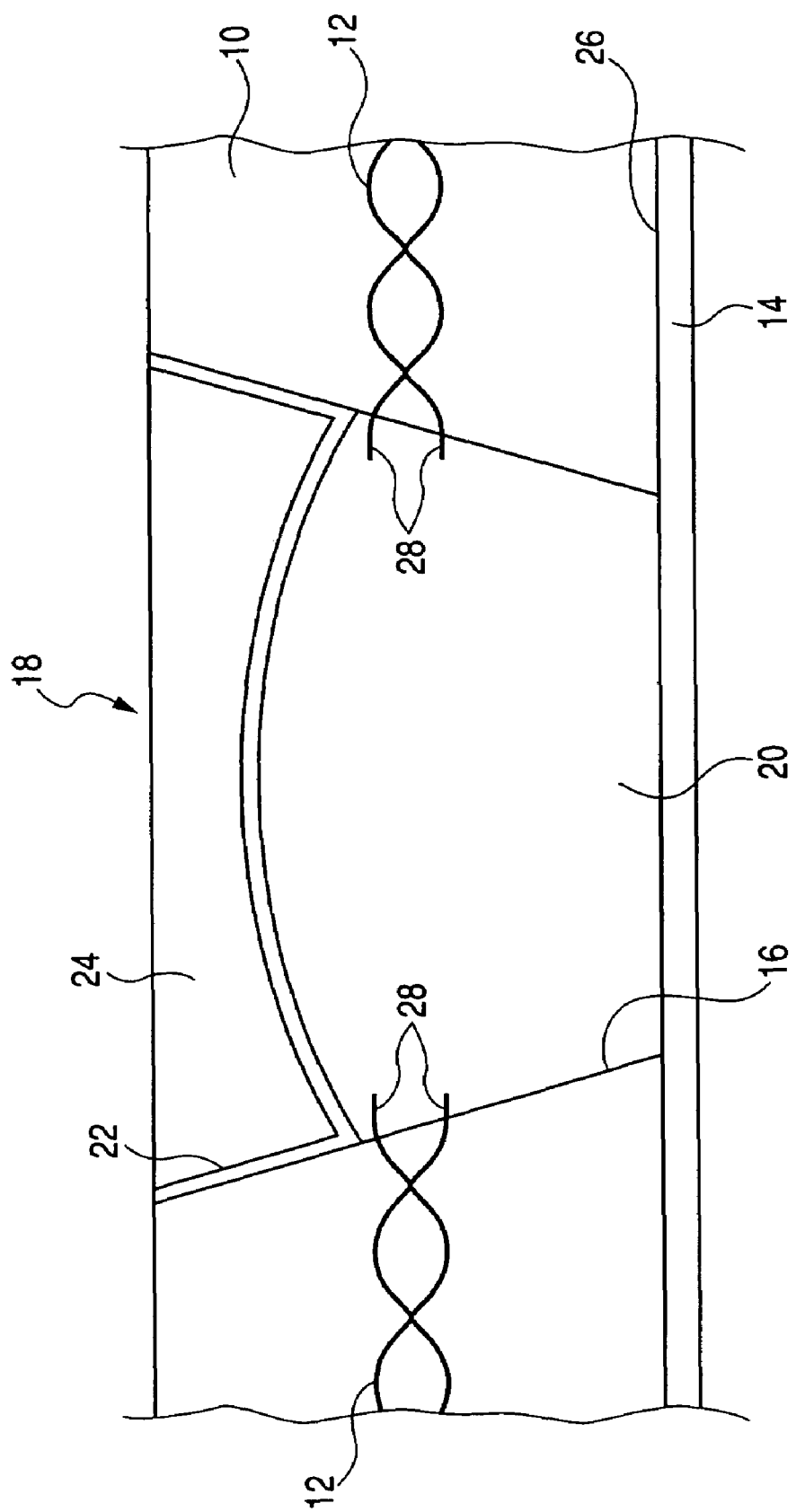
FIG. 1 is a main portion sectional view of an electronic component according to this embodiment.

FIG. 1 is a main portion sectional view of a base material of an electronic component according to this embodiment.

Here, the base material is what constitutes the framework of the electronic component; wiring layers are respectively laminated on the front and back surfaces of the base material, thus forming wiring patterns. The respective wiring patterns formed on the front and back surfaces of the base material are electrically connected to each other through a conductor part formed in a via hole of the base material described below.

As shown in the drawing, a base material 10 forming the electronic component according to this embodiment is formed as a flat resin plate, and has at its central portion a core material 12 for securing the strength of the base material 10 itself. While in this embodiment the core material 12 is formed by a glass cloth containing glass fibers woven therein, this should not be construed restrictively; it is also possible to adopt some other material as long as it helps to reinforce the base material 12 itself.

On the lower surface of the base material 12 shown in the drawing, there is provided a wiring layer 14, which serves as an electrode for forming the conductor part by electroplating in the electronic component producing process of this embodiment described below. Further, in the central portion of the drawing, there is formed a reverse-cone-shaped via hole 16 extending through the base material 10; further, inside the via hole 16, there is formed a conductor part 18 for effecting electrical conduction between the wiring patterns (not shown) formed on the front and back sides of the base material 10. The conductor part 18 is formed by stacking together three layers: a first plating layer 20, an electroless plating layer 22, and a second plating layer 24 stacked in that order as from the lower surface side (that is, the wiring layer 14 side) of the base material 10.

The first plating layer 20 is formed by electroplating using the wiring layer 14 as an electrode, and its height is set to a dimension large enough to extend from the surface 26 of the wiring layer 14 to a height where it covers the core material 12. Incidentally, as shown in the drawing, the core material 12 protrudes from the inner wall surface of the via hole 16, and the protruding portion 28 of the core material 12 enters the first plating layer 20 to form an anchor structure.

The electroless plating layer 22, situated on the first plating layer 20, is formed so as to cover the upper surface portion of the first plating layer 20 and the portion of the inner wall surface of the via hole 16 which is above the portion where the first plating layer 20 is formed. The electroless plating layer 22 is formed by so-called chemical plating, so that, as compared with a layer formed by electroplating, exhibits higher affinity (adherence) with respect to the base material 10, whereby the base material 10 and the conductor part 18 are firmly connected together by the electroless plating layer 22. Thus, it is necessary for the electroless plating layer 22 to have such a thickness as corresponding to those of the first plating layer 20 and the second plating layer 24; it has only to have a minimum thickness providing the requisite bonding strength. Further, in order to enhance the bonding strength of the electroless plating layer 22 with respect to the inner wall surface of the via hole 16, the first plating layer 20 is formed to a height where it covers the core material 12 such that the electroless plating layer 22 may not come into contact with the core material 12.

Formed on the electroless plating layer 22 is the second plating layer 24, which is formed by electroplating using the wiring layer 14 as an electrode as in the case of the first plating layer 20.

In this way, the conductor part 18 filling the via hole 16 is formed of two electroplatings with an electroless plating therebetween, which means it is formed of a highly pure metal member, thereby achieving a reduction in resistance. Further, in this conductor part 18, an anchor structure is formed by a protrusion 28 consisting of the core material 12 protruding from the via hole 16 and the first plating layer 20; further, due to the electroless plating layer 22, an improvement is achieved in terms of bonding strength with respect to the base material 10, so that even if an external force is applied to the via hole 16, it is possible to prevent detachment of the conductor part 18 from the via hole 16.

A process for producing the electronic component, constructed as described above, will be illustrated.

FIG. 2A, FIG. 2B, FIG. 2C, FIG. 3A, FIG. 3B, and FIG. 3C are explanatory process diagrams for illustrating a process for producing the electronic component according to this embodiment.

Figure 2A:
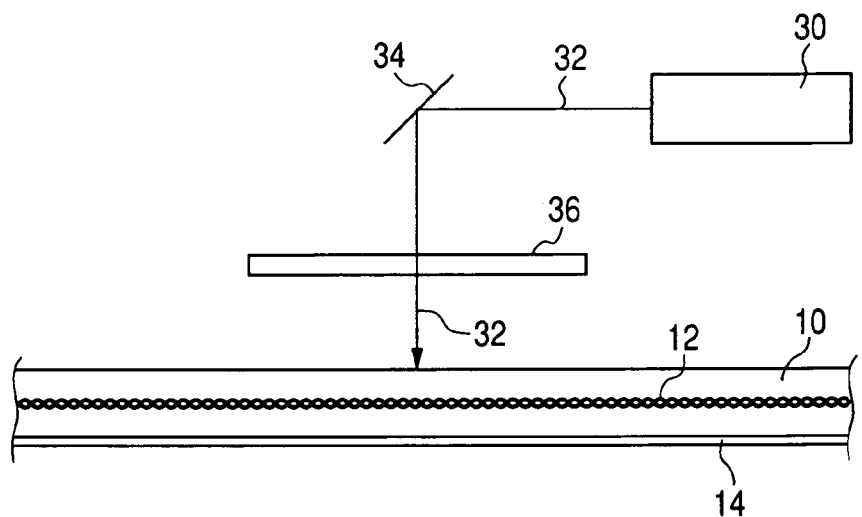
FIGS. 2A, 2B, and 2C are explanatory process diagrams for illustrating the electronic component producing process of this embodiment.
Figure 2B:
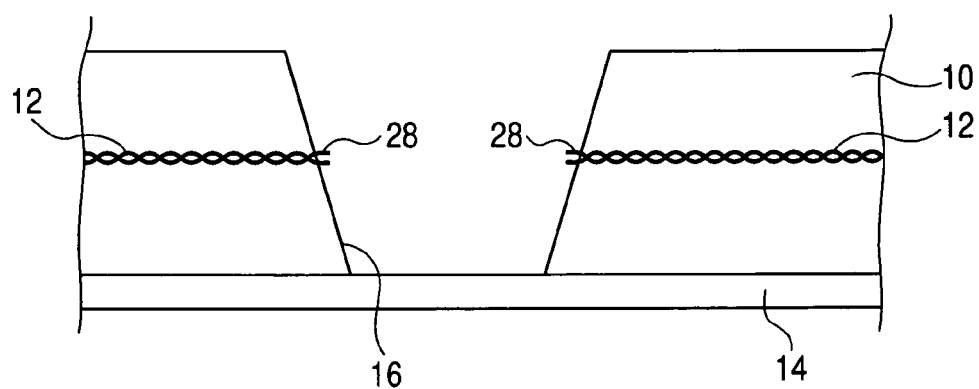

First, as shown in FIG. 2A, when forming the via hole 12 in the base material 10, the base material 10, which constitutes the object of processing, is placed on a stage (not shown) such that the wiring layer 14 is on the lower side. After the base material 10 has been placed on the stage, a laser beam 32 is applied to the processing position of the base material 10 by using a laser processing device (e.g., carbon dioxide laser) 30 mounted on the upper side of the base material 10. A first member 34 and a second member 36 arranged in the optical path of the laser beam 32 are optical members for adjusting the path, etc. of the laser beam 32; they are used as appropriate according to the various processing conditions. When the laser beam 32 is applied to the base material 10 by thus using the laser processing device 30, the resin forming the base material 10 is melted as shown in FIG. 2B, and the via hole 16 is formed. In view of the difference in melting temperature between the resin forming the base material 10 and the core material 12, the power of the laser beam 32 is adjusted such that the core material 12 protrudes from the inner wall surface of the via hole 16, whereby it is possible to form the protrusion 28 protruding from the inner wall surface of the via hole 16.

Figure 2C:
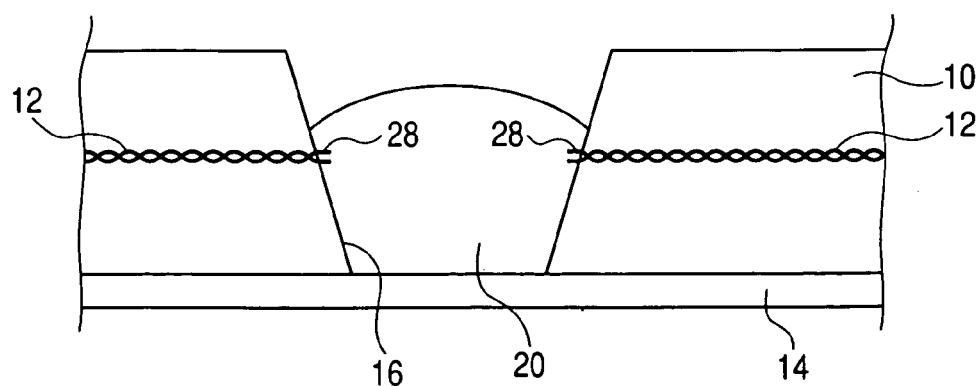

After the via hole 16 has been formed in the base material 10 through application of the laser beam 32 as shown in FIG. 2B, the first plating layer 20 is formed in the via hole 16 by electroplating using the wiring layer 14 as an electrode as shown in FIG. 2C. The height of the first plating layer 20 is made high enough to cover the protrusion 28 such that the electroless plating layer 22 may not come into contact with the protrusion 28. The setting of the height dimension of the first plating layer 20 is controlled through time setting for electroplating.

Figure 3A:
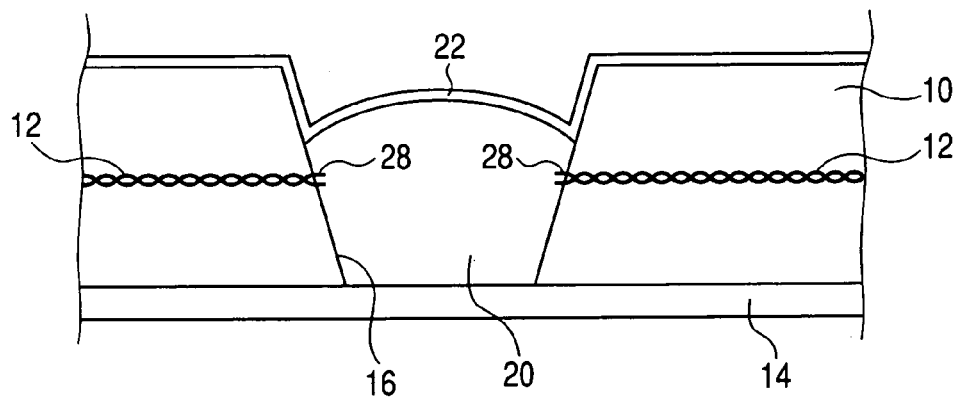
FIGS. 3A, 3B, and 3C are explanatory process diagrams for illustrating the electronic component producing process of this embodiment.

After the first plating layer 20 has been thus formed in the via hole 16, the upper surface of the base material 10 is immersed in a chemical plating liquid to effect electroless plating as shown in FIG. 3A. By thus performing electroless plating on the base material 10, the electroless plating layer 22 is formed on the upper surface of the base material 10, the upper surface of the first plating layer 20, and the inner wall surface of the via hole 16.

Figure 3B:
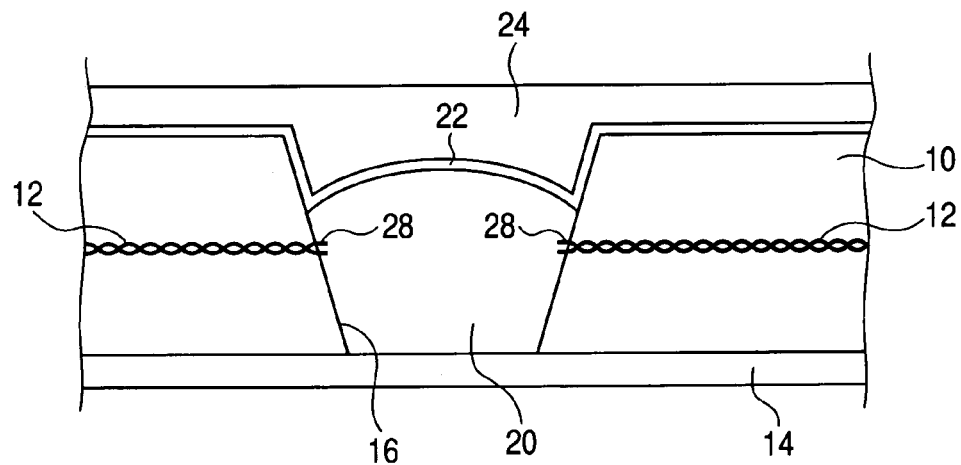
Figure 3C:
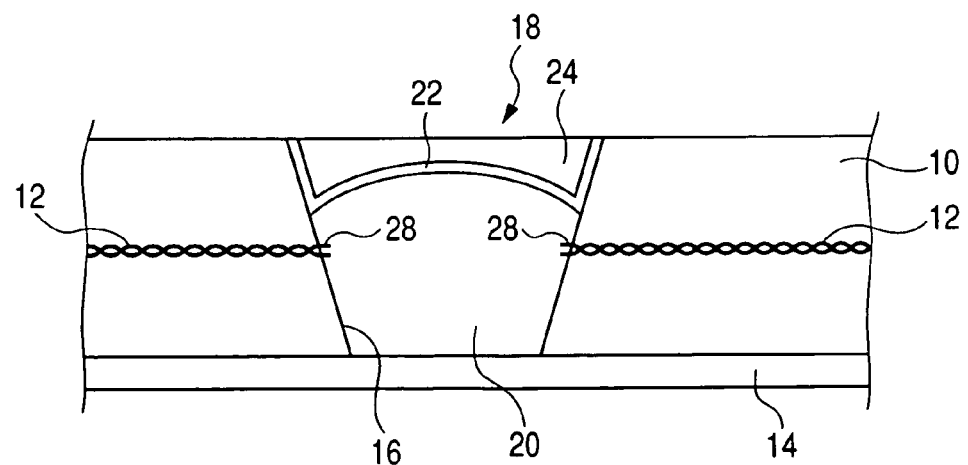

Next, after the electroless plating layer 22 has been formed on the upper surface side of the base material 10 as shown in FIG. 3A, the second plating layer 24 is formed on the upper surface side of the electroless plating layer 22 using the wiring layer 14 as an electrode as in the case of the formation of the first plating layer 20 as shown in FIG. 3B. After the completion of the second electroplating process, the electroless plating layer 22 and the second plating layer 24 formed on the upper surface of the base material 10 are removed by a photoetching process or the like to form in the via hole 16 the conductor part 18 of a three-layer structure. FIG. 3C shows the state where the conductor part 18 has been formed in the via hole 16.

The conductor part 18 formed by the above procedures contains no resin component like a conductive paste, for example, so that it can attain low resistivity. Further, due to the high purity of its metal component, it is superior in heat dissipation property; when, for example, wiring patterns are formed on the front and back surfaces of the base material 10, it is possible to efficiently dissipate to the exterior any heat generated in the electronic component through the metal conductor part stacked on the conductor part 18.

While in the above-described embodiment the conductor part 18 has a three-layer structure, this should not be construed restrictively; it is possible to adopt various forms.

FIG. 4 is a main portion sectional view of an application example of the electronic component of this embodiment.

Figure 4A:
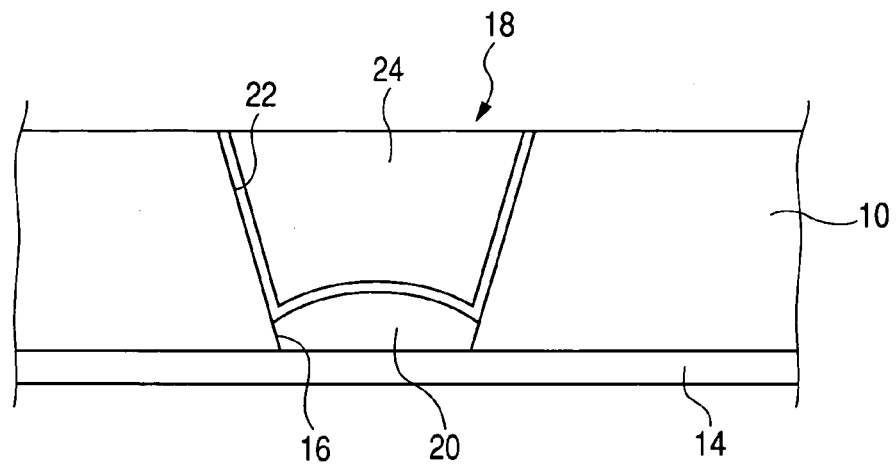
FIGS. 4A and 4B are main portion sectional views of an application example of the electronic component of this embodiment.

As shown in FIG. 4A, when no core material 12 exists in the base material 10, or, when any core material 12 existing involves no problem if it comes into contact with the electroless plating layer 22, it is possible to appropriately change the thickness dimensions of the layers of the conductor part 18. As shown in FIG. 4A, the thickness of the first plating layer 20 is reduced to enlarge the formation area of the electroless plating layer 22 formed on the via hole 16. This helps to further enhance the bonding strength due to the electroless plating layer 22.

Figure 4B:
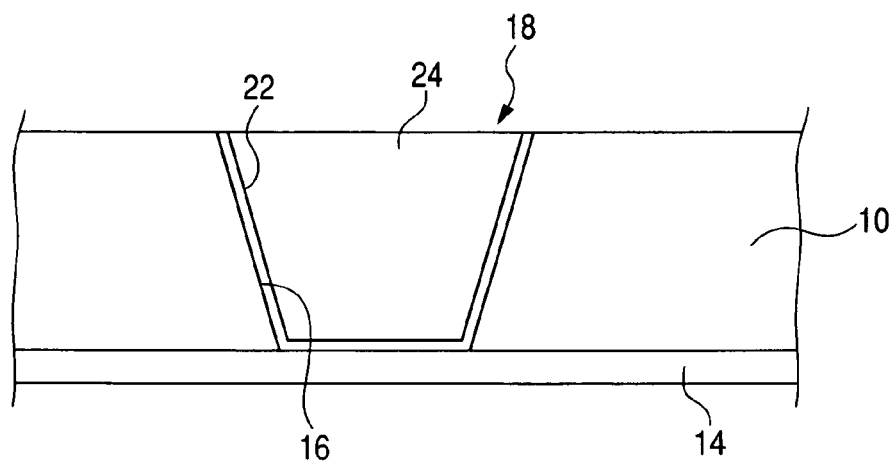

Further, as shown in FIG. 4B, it is also possible to eliminate the first plating layer 20 and to further enlarge the formation area of the electroless plating layer 22. By adopting this construction, it is possible to maximize the bonding strength due to the electroless plating layer 22.

Figure 5:
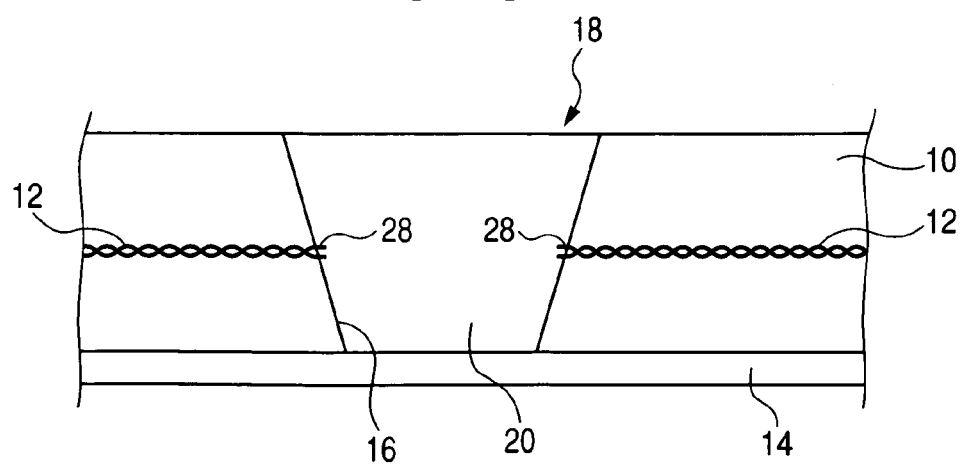
FIG. 5 is a main portion sectional view illustrating how an improvement in the bonding strength for the conductor part with respect to the via hole is achieved only through an anchor structure.

While in this embodiment the bonding strength for the conductor part 18 with respect to the via hole 16 is enhanced through a combination of the anchor structure based on the protrusion 28 and the electroless plating layer 22, this should not be construed restrictively; it is also possible to enhance the bonding strength for the conductor part 18 with respect to the via hole 16 only through the anchor structure. FIG. 5 is a main portion sectional view of a construction in which the enhancement of the bonding strength for the conductor part with respect to the via hole is achieved only through the anchor structure.

As shown in the drawing, by causing the protrusion 28 to protrude from the inner wall surface of the via hole 16 and performing electroplating so as to include the protrusion 28 to form the first plating layer 20, it is possible to physically retain the conductor part 18 by the protrusion 28; this construction also helps to achieve an enhancement in bonding strength.

While in this embodiment the conductor layer for forming the conductor part 18 in the via hole 16 is used also as the wiring layer 14 after the formation of the conductor part 18, this should not be construed restrictively; it is naturally also possible, for example, to form a power supply layer by performing electroless plating, electrolytic plating, etc. after entirely removing the conductor layer from the base material 10 by etching or the like and then perform electrolytic plating after effecting exposure and development with a dry film attached to thereby form a new wiring layer, thereby providing an electronic component suitable for high density wiring. Regarding the procedures for forming the new wiring layer, it goes without saying that the kind of plating and the processes such as exposure and development are modified as appropriate according to the specifications of the product.

As described above, according to the present invention, there are provided a base material with a conductor layer formed on at least one side thereof, a via hole formed by laser irradiation from the other surface side of the base material, an electroless plating layer in close contact with the inner wall surface of the via hole, and a conductor part which covers the electroless plating layer and which is formed in the via hole, whereby it is possible to achieve an improvement in the heat dissipation property and a reduction in the resistivity of the conductor part, and to achieve an enhancement in the bonding strength for the conductor part with respect to the base material, making it possible to achieve an improvement in the reliability of the component itself.

The invention claimed is:

1. A process for producing an electronic component which effects conduction processing between front and back surfaces of a base material equipped with a core material and having a wiring layer formed on one surface thereof, the process comprising:
   a first step to form a via hole in the base material having the wiring layer by performing laser irradiation at least from the other surface side of the base material to expose a surface of the wiring layer;
   a second step to deposit a first electroplating by using the wiring layer as an electrode until the core material protruding from the inner wall surface of the via hole is covered;
   a third step to form an electroless plating layer in close contact with an inner wall surface of the via hole and without contacting the core material such that the electroless plating layer covers all the inner wall surface of the via hole and the first electroplating;
   a fourth step to deposit a second electroplating by using the wiring layer as an electrode to cover the electroless plating layer and to completely fill the via hole.
   wherein three layers in order from a wiring-layer side: the first electroplating layer; the electroless plating layer; and the second electroplating layer, are stacked in the via hole to thereby form a conductor part.

2. A process for producing an electronic component according to claim 1, wherein a laser beam is applied onto the base material with a power of the laser beam adjusted in view of a difference in melting temperature between resin forming the base material and the core material such that the core material protrude from the inner wall surface of the via holes to thereby form an anchor structure with respect to the conductor part.

3. A process for producing an electronic component according to any one of claims 1 and 2, wherein the core material is formed of glass cloth.

* * * * *